United States Patent [19]
Doi et al.

[11] Patent Number: 5,527,647
[45] Date of Patent: Jun. 18, 1996

[54] PHASE SHIFT MASK AND ITS MANUFACTURING METHOD

[75] Inventors: Kazumasa Doi; Kazuhiko Sumi, both of Kawasaki, Japan

[73] Assignee: Fujitsu Limited, Kawasaki, Japan

[21] Appl. No.: 304,546

[22] Filed: Sep. 12, 1994

[30] Foreign Application Priority Data

Dec. 10, 1993 [JP] Japan .................. 5-310902

[51] Int. Cl.[6] .................................. G03F 9/00
[52] U.S. Cl. .................. 430/5; 430/296; 430/322; 430/323; 430/394
[58] Field of Search ................. 430/5, 296, 322, 430/323, 324, 325, 326, 328, 329, 394

[56] References Cited

U.S. PATENT DOCUMENTS 4,890,309  12/1989  Smith et al. .................. 430/5
5,380,609   1/1995  Fujita et al. .................. 430/5

FOREIGN PATENT DOCUMENTS 0462560  12/1991  European Pat. Off. .

Primary Examiner—S. Rosasco
Attorney, Agent, or Firm—Nikaido, Marmelstein, Murray & Oram

[57] ABSTRACT

A method for manufacturing a phase shift mask of the invention comprises a process of protecting a side wall of an opening in a light-damping film by means of a resist and then etching the light-damping film to be so thin as a halftone film.

26 Claims, 9 Drawing Sheets

FIG.4
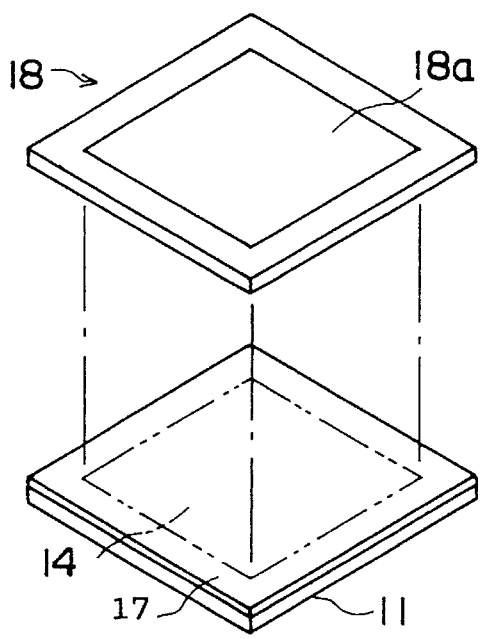
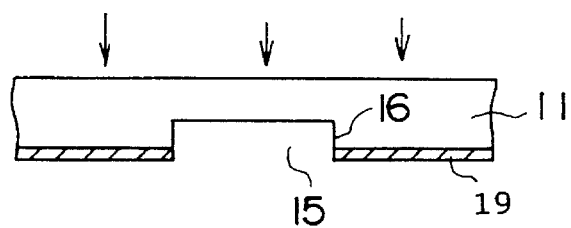
FIG.5A
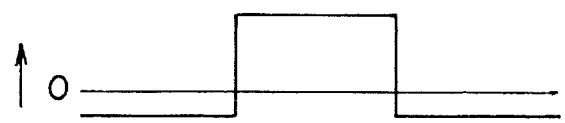
FIG.5B
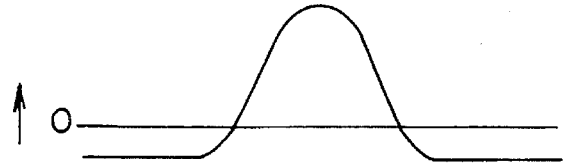
FIG.5C
FIG.5D 5,527,647

PHASE SHIFT MASK AND ITS MANUFACTURING METHOD

BACKGROUND OF THE INVENTION

1. Field of the Invention

The present invention relates to a phase shift mask and its manufacturing method, and more specifically to a phase shift mask of halftone type used for lithography technology and to a method for manufacturing the phase shift mask of halftone type.

2. Description of the Related Art

With increased miniaturization of circuit patterns in a semiconductor device, it is necessary to improve a photolithography in resolution which is used in a patterning process. Improvement of photomasks has made progress in improving resolution of the photolithography, and a phase shift mask of halftone type using a halftone film (semitransparent film) is known as one of the improved photomasks. Such a photomask has been suggested, for example, in U.S. Pat. No. 4,890,309.

A phase shift mask of halftone type is generally manufactured in, for example, the following process.

First, as shown in FIGS. 1A and 1B, a halftone film 2 and a shading film 3 are one after another formed on a glass substrate 1, and then, as shown in FIG. 1C, an electron-beam resist 4 of positive type is applied onto the shading film 3.

Next, a latent-image pattern is formed by means of electron-beam exposure on a part of the electron-beam resist 4 existing in a device pattern forming area 5, and the whole device pattern forming area 5 is uniformly irradiated with an electron beam which has been reduced in dose. When the electron-beam resist 4 is developed, as shown in FIG. 1D, the electron-beam resist 4 is made thin in the device pattern forming area 5 and a part of it corresponding to the latent-image pattern is opened to form a window 6.

After this, the halftone film 2 and the shading film 3 under the electron-beam resist 4 are etched by means of a wet etching or dry etching method as using the electron-beam resist 4 as a mask to make a light-transmitting pattern 7 open as shown in FIG. 1E.

Next, a part of the glass substrate 1 exposed from the light-transmitting pattern 7 is etched by means of a reactive ion etching method (RIE) to form a dented part 8 to be a phase shifter, as shown in FIG. 1F. Depth of the dented part 8 is made equal to the thickness of a glass layer to shift an incident light by 180 degrees in phase. For example, the dented part is made to be 3890 Å in depth in case of forming a phase shift mask for i rays. In a step where the dented part 8 has been formed in the glass substrate 1 in this manner, the electron-beam resist 4 is removed from the device pattern forming area 5 by means of oxygen plasma and the like.

And as shown in FIG. 1G, a part of the shading film 3 existing in the device pattern forming area 5 is etched off by using the electron-beam resist 4 left on the glass substrate 1 as a mask.

Finally, when the electron-beam resist 4 is removed with a solvent as shown in FIG. 1H, a phase shift mask of halftone type is completed.

In case of using the phase shift mask in an exposure process, a light beam passing through the light-transmitting pattern 7 of the phase shift mask is little damped while a light beam passing through the halftone film 2 is damped to a degree of 10% of it. And the light beam passing through the light-transmitting pattern 7 and the light beam passing through the halftone film 2 result in being different by 180 degrees in phase from each other thanks to action of the dented part 8.

The reason why a shading film 3 is disposed around the device pattern forming area 5 is as follows. In the case of performing an exposure process as using a phase shift mask and a stepper, if such a part to be repeatedly exposed as a boundary (scribing area) between plural device areas or an alignment mark necessary for aligning a mask is covered with a halftone film 2, lights passing through the halftone film 2 are accumulated in the area and finally the area results in being in the same state as it has been irradiated with little-damped light beams. From this reason, such an area as around the device pattern forming area 5 is covered with the shading film 3. However, since a side etching S as shown in FIG. 2 may appear on the halftone film 2 between the shading film 3 and the glass substrate 1 when patterning the shading film 3, there may be an undesirable problem that a pattern of the halftone film 2 varies in shape. Additionally, it takes a long time to make an inspection for side etching in addition to the primary inspection for pattern defects in case of inspecting a finished phase shift mask by means of a surface inspection apparatus.

SUMMARY OF THE INVENTION

An object of the present invention is to provide a method for forming a phase shift mask which improves controllability of a pattern shape and smoothly make a pattern inspection.

The present invention comprises of applying a resist of negative type onto a light-damping film after patterning the light-damping film on a transparent substrate, and forming an opening to be a light-transmitting pattern in the light-damping film; exposing the resist by throwing a light on the reverse side of the substrate; and developing the resist to leave it only on the light-transmitting pattern and the shading area; and etching the light-damping film as using the resist as a mask until it becomes so thin as to be a halftone film. The shading area is, for example, around a device area.

Therefore, since a side part of the halftone film is protected by the resist of negative type when making the light-damping film thin, no side etching appears on the halftone film and the phase shift mask is improved in its pattern accuracy. Furthermore, since it will do to check for only pattern defects except side etching of a halftone film in inspection of a phase shift mask thanks to prevention of the side etching, the inspection is smoothly performed.

The light-damping film may be made of two layers of a halftone film and a shading film.

Another invention gives hydrophobic characteristics to a halftone film by making it contain fluorine.

Since a halftone film containing fluorine functions as an etching stopper, it is easy to control etching of a shading film when removing a part of the shading film formed on the halftone film by means of a wet etching method. At this time, no side etching effect appears on the halftone film.

BRIEF DESCRIPTION OF THE DRAWINGS

FIG. 4 is a perspective view showing an exposure process in the first embodiment of the invention.

FIG. 5A is a cross-sectional view showing a part of a phase shift mask of halftone type formed through a manufacturing process according to the first embodiment of the invention, FIG. 5B shows an optical amplitude in the phase shift mask, FIG. 5C shows an optical amplitude in an exposed object, and FIG. 5D shows an optical intensity in the exposed object.

DETAILED DESCRIPTION OF THE PREFERRED EMBODIMENTS

FIGS. 3A to 3I are cross-sectional views showing a process of manufacturing a phase shift mask according to a first embodiment of the invention.

Figure 1A:
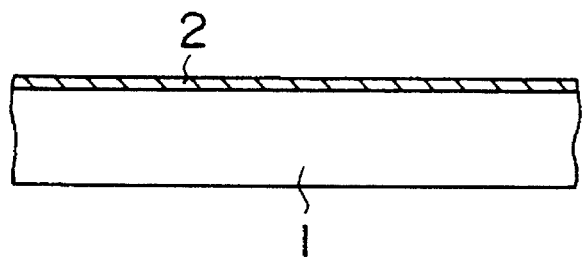
FIGS. 1A to 1H are cross-sectional views showing a process of manufacturing an ordinary phase shift mask of halftone type according to the prior art.
Figure 1B:
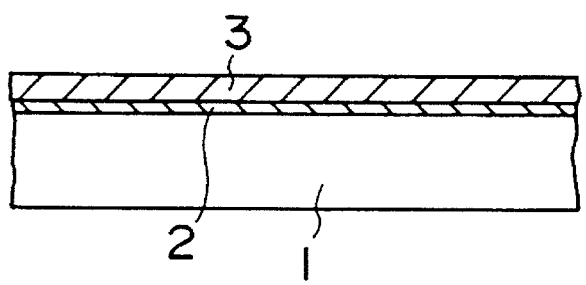
Figure 1C:
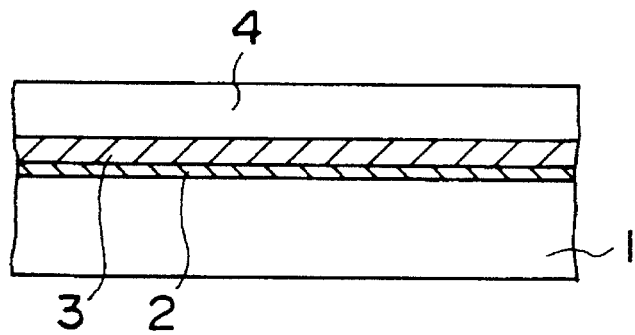
Figure 1D:
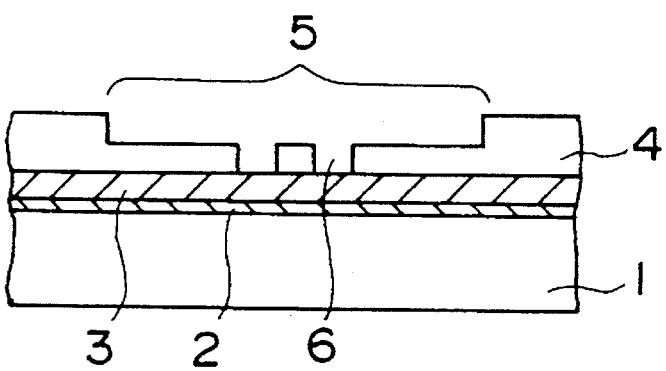
Figure 1E:
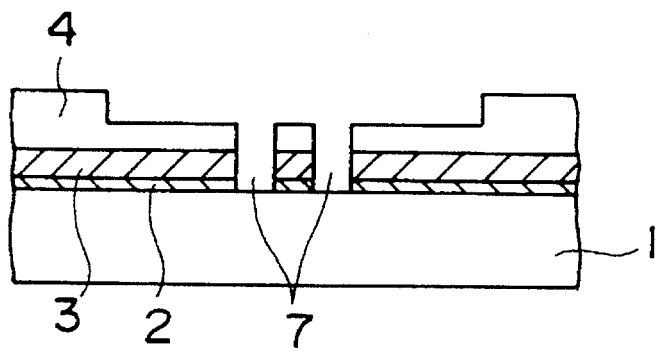
Figure 1F:
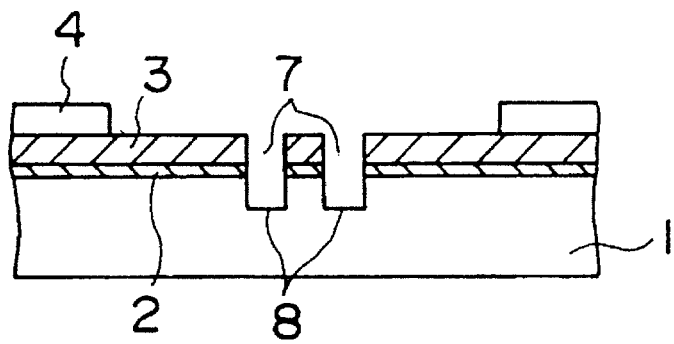
Figure 1G:
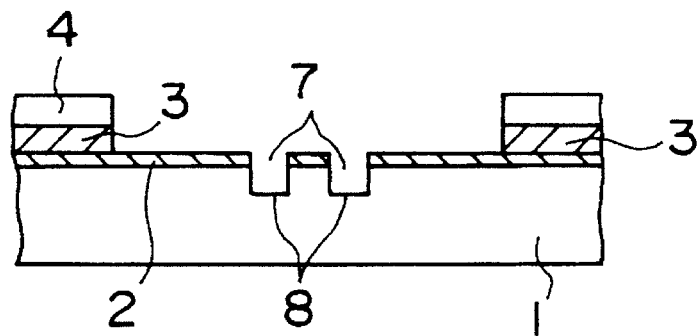
Figure 1H:
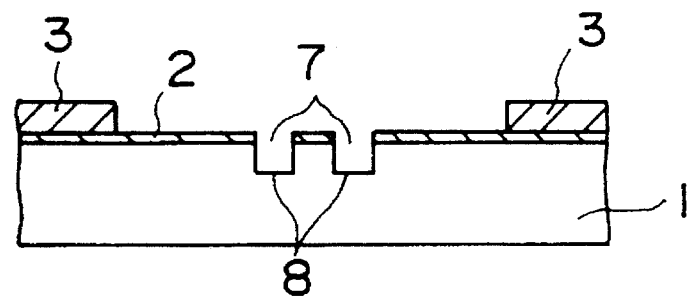
Figure 2:
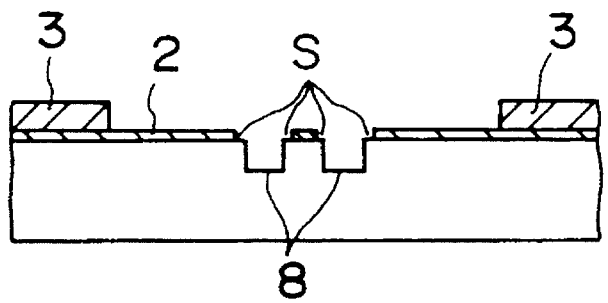
FIG. 2 is a cross-sectional view showing a phase shift mask of halftone type formed by a manufacturing process according to the prior art.
Figure 3A:
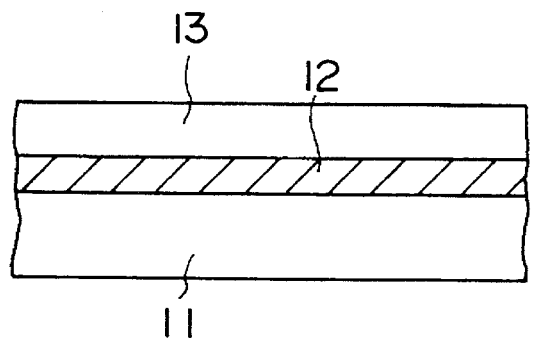
FIGS. 3A to 3I are cross-sectional views showing a process of manufacturing a phase shift mask of halftone type according to a first embodiment of the invention.

First, as shown in FIG. 3A, a light-damping film 12 whose light-transmission factor can be controlled by its film thickness is formed on a transparent substrate 11 made of quartz, glass, or the like, by means of sputtering. The light-damping film, which is made of chromium (Cr), chromium oxide (CrO), or chromium oxidic nitride (CRON), for example, is formed to be just thick enough to completely shut off light. For example, in case of using chromium, thickness of the light-damping film just when it has been finished is set at 0.06 μm.

After this, an electron-beam resist 13 is applied onto the light-damping film 12 to be 0.5 μm in thickness by means of a spinner. The electron-beam resist 13 can be of a negative type or a positive type.

Figure 3B:
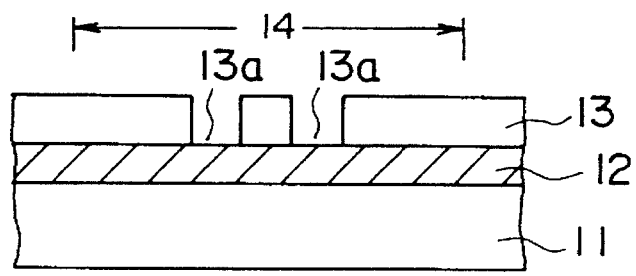

Next, after drawing a latent image pattern on a part of the electron-beam resist 13 existing in a device area 14 (an area where a device pattern is to be formed) by means of electron-beam exposure, a pattern 13a opened as shown in FIG. 3B is formed by developing the electron-beam resist 13.

Figure 3C:
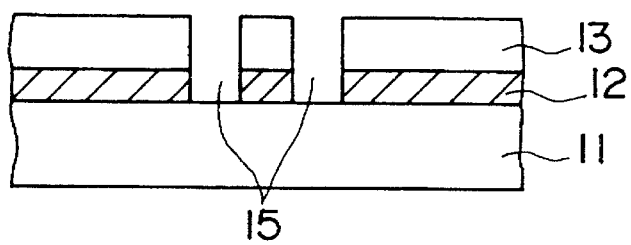

Then, as shown in FIG. 3C, an opening to be a light-transmitting pattern 15 is formed in the light-damping film 12 by etching a part of the light-damping film 12 exposed from the opened pattern 13a as using the electron-beam resist 13 as a mask. The etching process in this case may be either a dry etching process using a chlorine-family gas or a wet etching process.

Figure 3D:
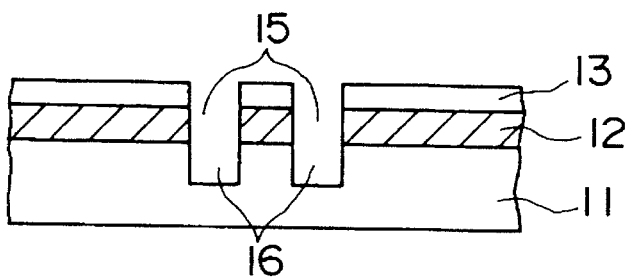

And then as shown in FIG. 3D, a dented part 16 is formed under the light-transmitting pattern 15 by etching a part of the transparent substrate 11 by means of an RIE process using such a reactive gas of chlorine-family as $CF_4$ or $CHF_3$, as using the electron-beam resist 13 again as a mask.

The dented part 16 has depth enough to shift a light beam passing through it by 180 degrees in phase from another light beam passing through a part of the transparent substrate 11 around it. The depth is given by the following expression, $$d=\lambda/[2(n_1-n_0)]$$

where $\lambda$ is wavelength of an exposure light, $n_o$ is the refractive index of the air, and $n_1$ is the refractive index of material composing the transparent substrate 11.

For example, in case of forming a phase shift mask for i-rays with a transparent substrate 11 made of quartz (or silica), d=3890 A.

After the above-mentioned process, the electron-beam resist 13 is removed. The removing method may be a method using either of oxygen plasma and a solvent.

Figure 3E:
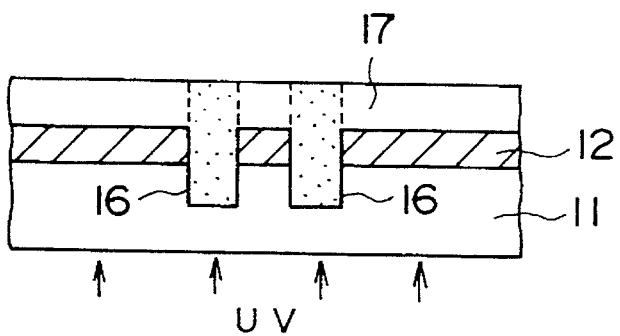

Next, as shown in FIG. 3E, a photoresist 17 of negative type is applied onto the dented part 16 of the transparent substrate 11 and the light-damping film 12 to be 1.0 μm in thickness. And as using the light-damping film 12 as a mask, the photoresist 17 of negative type is exposed to ultraviolet rays (UV) thrown through the downside of the transparent substrate 11, namely, the face on which no photoresist 17 of negative type exists.

Next, as shown in FIG. 4, the photoresist 17 of negative type is exposed to a light directed from above of the transparent substrate 11 by means of a reticle 18 having a simple shading pattern 18a to shade the device area 14.

Figure 3F:
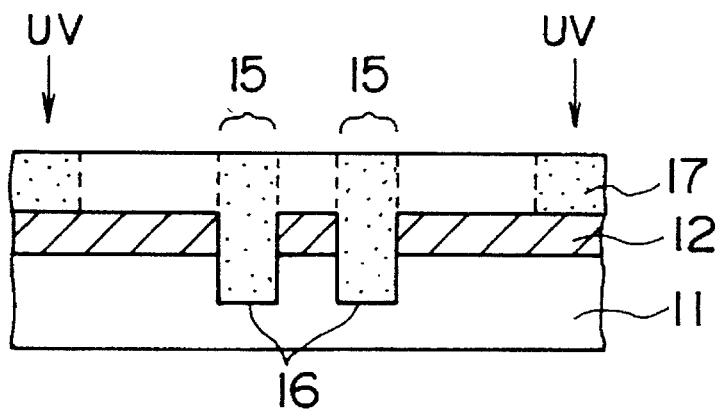
Figure 3G:
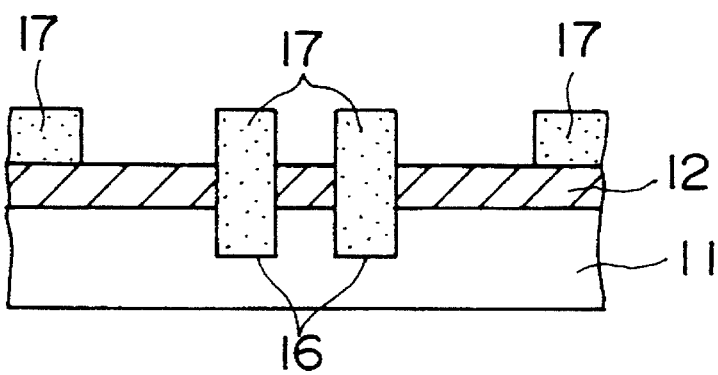

Thus, as shown in FIG. 3F, only an area where the dented part 16 is formed and an area around the device area 14 (shading area) result in being exposed to ultraviolet rays. Therefore, when the photoresist 17 is developed, the photoresist 17 is left only on the dented part 16 and the area around the device area 14 which have been exposed to the ultraviolet rays, as shown in FIG. 3G.

Figure 3H:
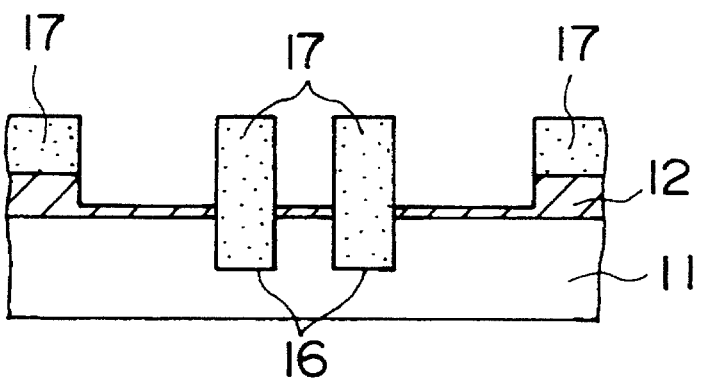

Next, as shown in FIG. 3H, the light-damping film 12 is made thin by means of a dry etching or wet etching method using the photoresist 17 as a mask so that the film 12 may transmit, for example, 5 to 15% of an exposure light.

The light-damping film 12 made of a material of the chromium family is etched by a dry etching method using a reactive gas of the chlorine family or a wet etching method using a cerium diammonium nitrate solution.

In this etching process, since side walls of parts of the light-damping film 12 around the light-transmitting pattern 15, namely, around the dented part 16 are protected by the photoresist 17 of negative type, the side walls of the light-damping film 12 in the device area 14 are not etched.

Figure 3I:
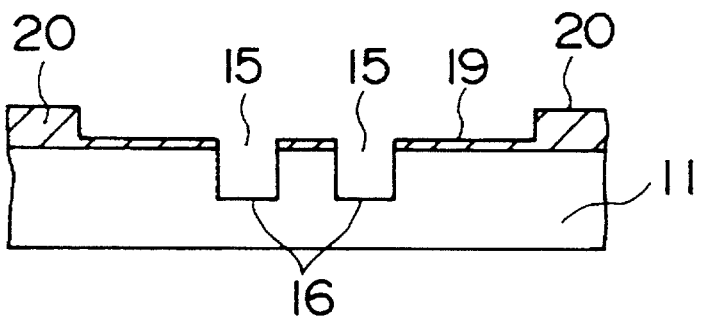

After this, as shown in FIG. 3I, when the photoresist 17 of negative type is removed, a phase shift mask of halftone type is completed. The thinned light-damping film 12 functions as a shading film 20 around the device area 14 as well as functions as a halftone film 19.

In a phase shift mask formed through such a process as mentioned above, since the halftone film 19 is not narrowed by a side etching effect in an area around the light-transmitting pattern 15, the edge part of the dented part 16 and the edge part of the halftone film 19 come to coincide with each other and so the pattern is improved in accuracy.

Thus, inspection of the phase shift mask is smoothly performed thanks to making clear defective parts of the pattern and furthermore a photolithography technique using the phase shift mask improves the pattern in accuracy.

In case of exposing a photoresist film (not shown) using such a phase shift mask of halftone type as mentioned above, a light is applied onto the film through the flat face of the transparent substrate 11 as shown in FIG. 5A. In this case, distribution of light intensity on the phase shift mask is as shown in FIG. 5B, where the exposure light is transmitted through the light-transmitting part (dented part) 15 as being shifted by 180 degrees in phase as it is hardly damped, while about 5 to 15% of the exposure light is transmitted through the halftone film 19.

And a light of such amplitude as shown in FIG. 5C is applied onto the photoresist to be exposed. Since a light which has passed through the light-transmitting pattern 15 and a light which has passed through the halftone film 19 are different by 180 degrees in phase from each other, the light intensity is zero in the edge part of the light-transmitting pattern 15.

And the light intensity on the photoresist is as shown in FIG. 5D and since a light of 0 degree in phase and a light of 180 degrees in phase overlap each other in the edge part of the light-transmitting pattern 15, the edge part results in being hardly exposed to light.

The above-mentioned phase shift mask of halftone type uses the same material for its halftone film and shading film, but different materials can be used for them. And it will do that a phase shifter is formed on a transparent substrate by using a transparent film instead of a dented part for phase shifting. Embodiments of the invention considering these points are described below.

FIGS. 6A to 6I are cross-sectional views showing a process of manufacturing a phase shift mask of halftone type according to a second embodiment of the invention.

Figure 6A:
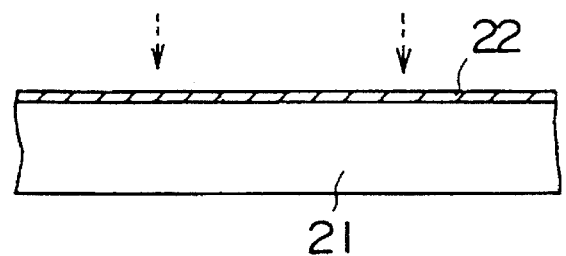
FIGS. 6A to 6I are cross-sectional views showing a process of manufacturing a phase shift mask of halftone type according to a second embodiment of the invention.

First, as shown in FIG. 6A, a halftone film 22 is formed on a transparent substrate 21 by means of sputtering. The halftone film 22, which is made of CrO or CrON for example, is made so thin that it may transmit about 5 to 15% of an exposure light. In case of using CrO, it is 0.135 to 0.11 μm in thickness.

Figure 6B:
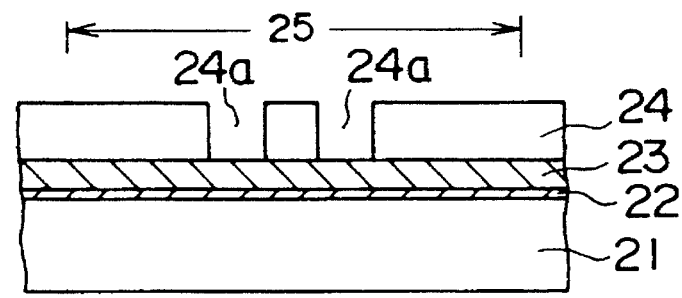

Next, as shown in FIG. 6B, a shading film 23 is formed on the transparent substrate 21 by sputtering and an electron-beam resist 24 is applied onto it. Then after drawing a latent image pattern on a part of the electron-beam resist 24 existing in a device area 25 by means of electron-beam exposure, the electron-beam resist 24 is developed to turn the latent image pattern into a visual image pattern. The visualized pattern becomes an opening 24a of the electron-beam resist 24.

In case of using Cr as a material of the shading film 23, the film is made to be 0.06 μm in thickness.

Figure 6C:
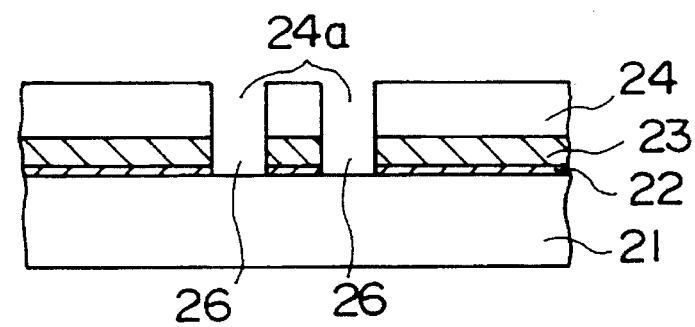
Figure 6D:
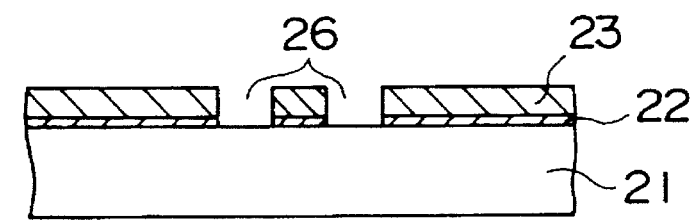

Next, as shown in FIG. 6C, an opening to be a light-transmitting pattern 26 is formed by patterning the shading film 23 and the halftone film 22 by means of photolithography using the electron-beam resist 24 as a mask. Then the electron-beam resist 24 is removed as shown in FIG. 6D.

Figure 6E:
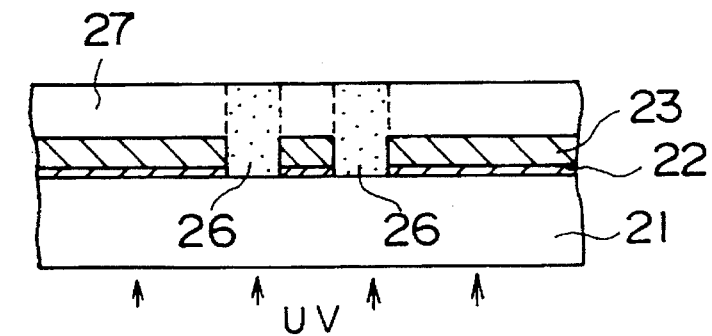
Figure 6F:
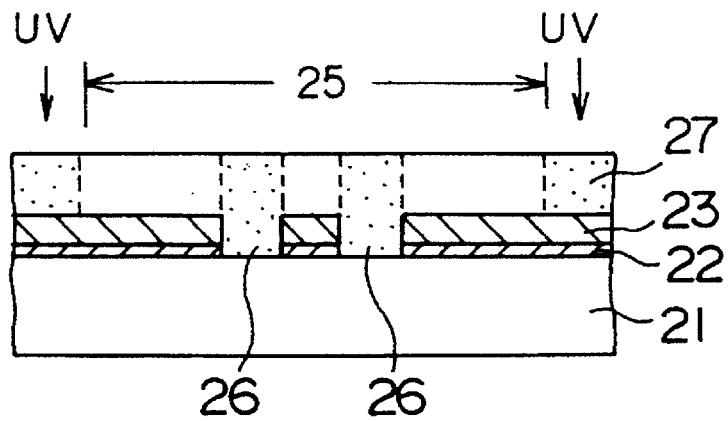

Next, as shown in FIG. 6E, a photoresist 27 of negative type is applied onto the light-transmitting pattern 26 and the shading film 23 to be 1.0 μm in thickness. And the photoresist 27 of negative type is exposed to ultraviolet rays (UV) as using the shading film 23 as a mask by throwing the ultraviolet rays through the downside face of the transparent substrate 21.

Figure 6G:
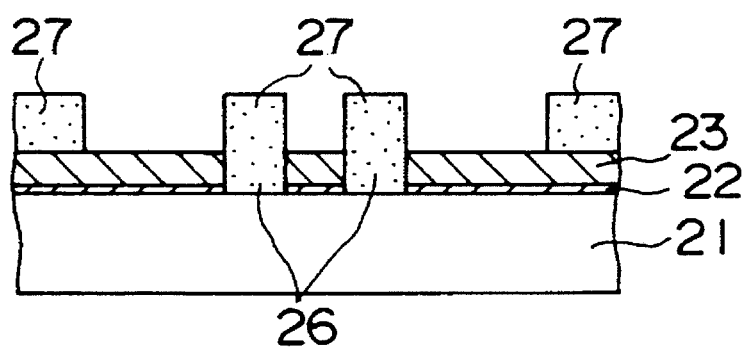

After this, when applying ultraviolet rays onto an area around the device area, namely, onto a part of the photoresist 27 of negative type existing in a shading area, only parts of the photoresist 27 of negative type existing on the light-transmitting pattern 26 and around the device area 25 are exposed to the ultraviolet rays. When the photoresist 27 of negative type is developed, it is left only in the areas exposed to the ultraviolet rays, as shown in FIG. 6G.

Figure 6H:
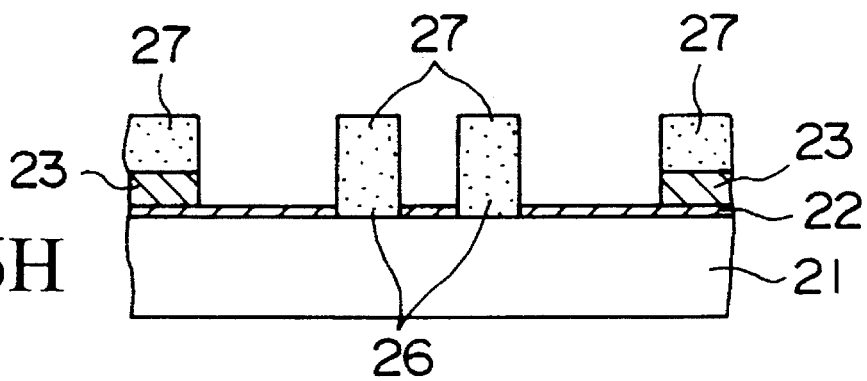

Next, as using the photoresist 27 of negative type as a mask, a part of the shading film 23 existing in the device area 25 is selectively etched off as shown in FIG. 6H. In this etching process, since the side walls of the halftone film 22 existing around the light-transmitting pattern 26 are protected by the photoresist 27 of negative type, they are not etched by a side etching effect.

In this way, a state is brought where the halftone film 22 and the light-transmitting pattern 26 are exposed in the device area 25 while the shading film 23 covers a part of the halftone film 22 existing in the shading area around the device area 25.

Figure 6I:
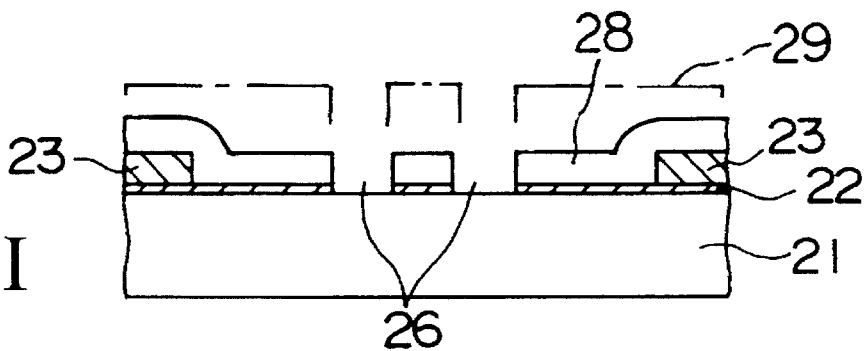

And after removing the photoresist 27 of negative type, as shown in FIG. 6I, a phase shifter 28 made by patterning an SiO$_2$ film is formed on the halftone film 22 and the shading film 23.

In order to make the phase shifter 28, an SiO$_2$ film not shown is first deposited. The SiO$_2$ film is sufficiently thick as to shift a light beam passing through the transparent substrate 21 by 180 degrees in phase. The thickness of the film is given by an expression of "$t=\lambda/[2(n_2-n_0)]$", where $\lambda$ is wavelength of an exposure light, $n_0$ is the refractive index of air, and $n_2$ is the refractive index of a material of the phase shift film. In case of forming a phase shift film for i-rays, $t=3890$ Å.

Next, a photoresist of positive type (not shown) is applied onto the SiO$_2$ film, and this photoresist is exposed to ultraviolet rays thrown through the downside face of the transparent substrate 21 as using the halftone film 22 as a mask, and then the photoresist is developed. Since a window having the same shape as the light-transmitting pattern is formed in the photoresist film by this process, the SiO$_2$ film on the light-transmitting pattern 26 is removed by means of an RIE process as using this photoresist film as a mask.

In this way, a light passing through the light-transmitting pattern 26 and a light passing through the halftone film 22 are made different by 180 degrees in phase from each other. In case of making the halftone film so thick as to shift the light passing through it by 180 degrees in phase, the light-transmitting pattern 26 is unnecessary.

Finally, when the photoresist is removed, a phase shift mask of halftone type as shown in FIG. 6I is completed.

In a phase shift mask formed as mentioned above, since the halftone film 22 is not etched by a side etching effect due to protection by the photoresist of negative type in removing the part of the shading film 23 existing in the device area 25, the phase shift mask is improved in pattern accuracy. Furthermore, inspection of the phase shift mask is smoothly performed because of making clear defective parts of the pattern.

The halftone film 22 and the shading film 23 in this case correspond to the light-damping film in the first embodiment.

FIGS. 7A to 7I are cross-sectional views showing a process of manufacturing a phase shift mask of halftone type according to a third embodiment of the invention.

Figure 7A:
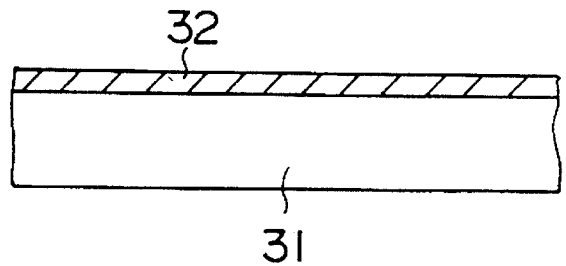
FIGS. 7A to 7I are cross-sectional views showing a process of manufacturing a phase shift mask of halftone type according to a third embodiment of the invention.

First, as shown in FIG. 7A, a transparent substrate 31 made of silica, glass, or the like is prepared which is 5 inches square in area and 0.09 inch in thickness.

Next, a halftone film 32 made of CrO is formed on the transparent substrate 31 to be 0.1 μm in thickness by means of sputtering. The halftone film is made so thick as to transmit about 5 to 15% of a light coming into it and shift the exposure light by 180 degrees in phase.

Figure 7B:
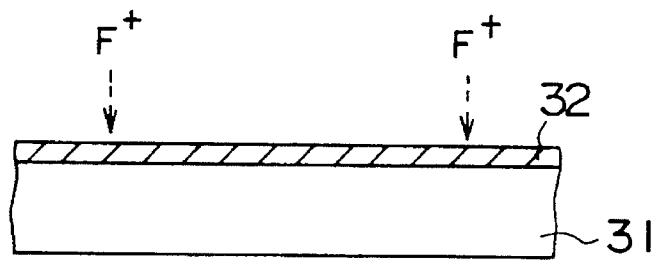

After this, as shown in FIG. 7B, hydrophobic characterics given to the halftone film 32 by implanting fluorine ions all over the halftone film 32, where a dose of the ions is $8.0 \times 10^{20}$ atoms / cm$^2$, which is an implanting condition for making it possible to distribute the fluorine ions not only on the surface of the halftone film 32 but also inside it.

Figure 7C:
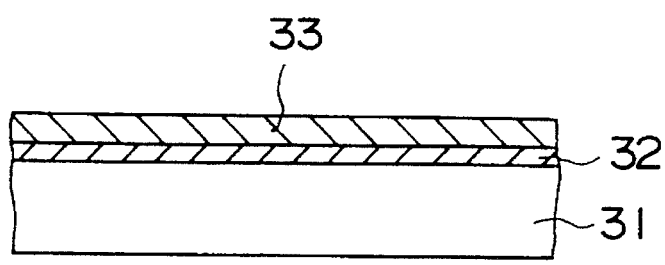
Figure 7D:
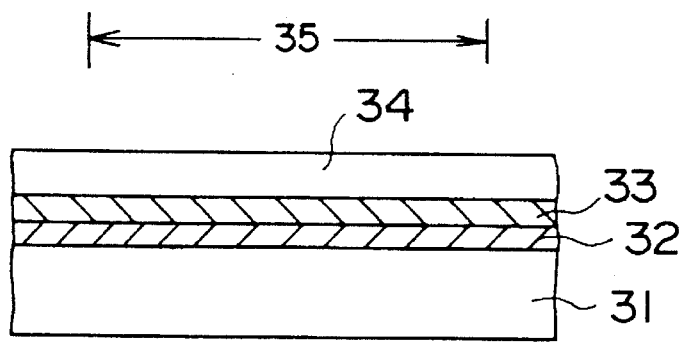

Next, as shown in FIGS. 7C and 7D, a shading film 33 made of Cr is formed on the transparent substrate 31 to be 0.06 μm in thickness by means of sputtering, and an electron-beam resist 34 is applied onto it to be 0.7 μm in thickness. A latent image pattern is drawn on the electron-beam resist 34 by means of electron-beam exposure, and then the part of the electron-beam resist 34 existing in the device area 35 is shallowly and uniformly exposed to an electron beam which is reduced in dose.

Figure 7E:
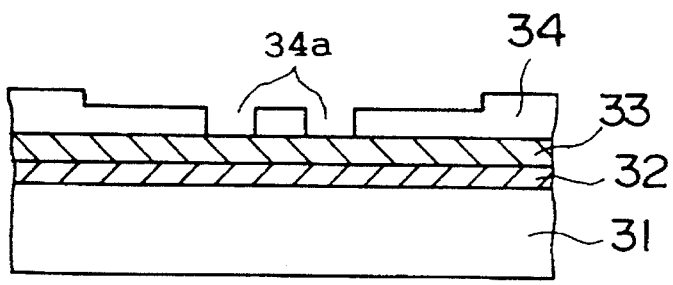

When the electron-beam resist 34 is developed, as shown in FIG. 7E, an opening 34a is formed in the part of the electron-beam resist film 34 corresponding to the latent image pattern, and furthermore, the electron-beam resist 34 left in the device area 35 is reduced in film thickness on the whole.

Figure 7F:
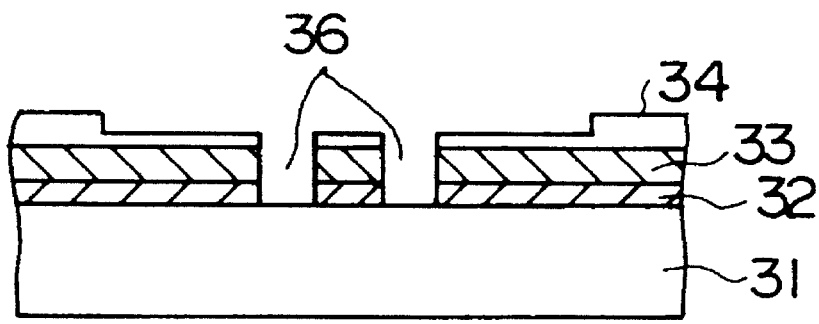
Figure 7G:
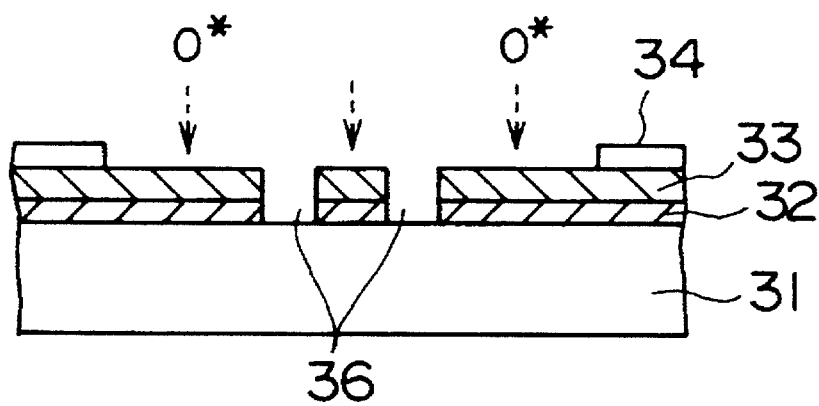

Next, as shown in FIG. 7F, the part of the shading film 33 and the halftone film 32 exposed through the opening 34a of the electron-beam resist 34 is removed by means of a dry etching process using a $CH_2C_{12}$ gas as using the electron-beam resist 34 as a mask. In this way, an opening to be a light-transmitting pattern 36 as shown in FIG. 7F is formed in the part of the shading film 33 and the halftone film 32 existing in the device area 35. Then, as shown in FIG. 7G, the whole electron-beam resist film 34 is etched by means of an oxygen plasma etching method so that a thin part of the electron-beam resist 34 which has been left thinly in the device area 35 may be removed.

Figure 7H:
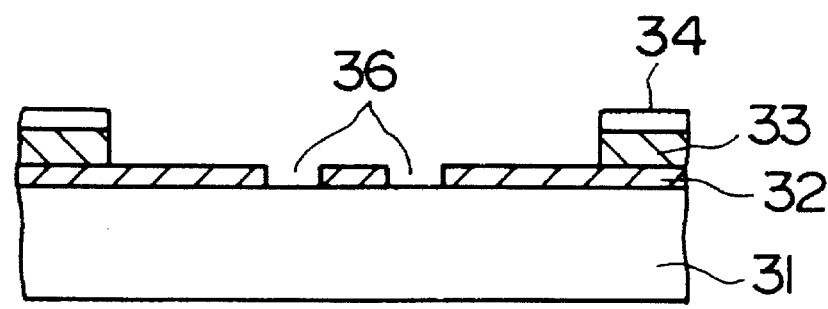

After this, as shown in FIG. 7H, the shading film made of Cr is etched off with a diammonium cerium nitrate solution as using the electron-beam resist film 34 left around the device area 35, namely, in the shading area as a mask. At this time, since the halftone film 32 containing fluorine is hydrophobic, it functions as an etching stopper without being etched by the etchant. In this case, it is a matter of course that the halftone film 32 is not etched by a side etching effect.

Thus, the shading film 33 is removed from the device area 35, and the halftone film 32 is not damaged by the etching.

In this way, the halftone film 32 results in being exposed from the device area 35.

Figure 7I:
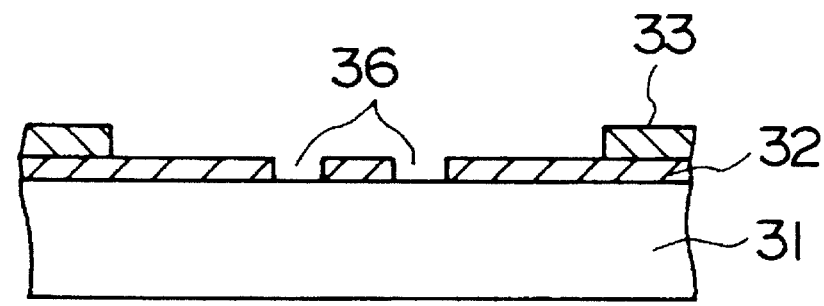

Finally, when the photoresist 34 of positive type is removed, a phase shift mask of halftone type as shown in FIG. 7I is completed.

In a phase shift mask formed as mentioned above, since the halftone film 32 is not thinned nor damaged when the part of the shading film 33 existing in the device area 35 is removed, the halftone film 32 functioning as a phase shifter can shift an exposure light precisely in phase.

Furthermore, since the halftone film 32 is not etched by a side etching effect when the shading film 33 is removed, the light-transmitting pattern 36 is precisely formed and moreover inspection of the phase shift mask is smoothly performed because of making clear defective parts of the pattern.

In the second embodiment also, implanting fluorine ions into the halftone film 22 in advance as shown in FIG. 6A makes it possible to control the etching process, since the shading film 23 can be selectively etched off in a process after this.

In the above-mentioned three embodiments, the shading film is supposed to be left only around the device area in order to simplify description of them, but in case of covering a part of the halftone film with the shading film, the shading film may be selectively left on the part of the halftone film by means of the above-mentioned methods.

What is claimed is:

1. A method for forming a halftone pattern of a phase shift mask, comprising the steps of:

forming a light-damping film on a transparent substrate;

applying a first resist on the light-damping film;

patterning the first resist;

forming a light-transmitting pattern on the light-damping film by etching the light-damping film using the first resist pattern as an etching mask;

applying a second resist of a negative type on the light-transmitting pattern so that at least a light-transmitting portion of the light-transmitting pattern is filled up with the second resist;

exposing the second resist to a light through a reverse side of the transparent substrate using the light-damping film as a mask, thereby enabling only the light-exposed portion of the second resist to be non-soluble in a developer;

removing unexposed portions of the second resist by developing thereof; and etching the light-damping film to reduce a film thickness thereof using the remaining second resist as an etching protection for the light-damping film, thereby forming a halftone pattern on the transparent substrate.

2. The method as defined in claim 1, wherein the light-damping film is formed of one material using as halftone film.

3. The method as defined in claim 2, wherein the light-damping film is formed of either of chromium, chromium oxide, and chromium oxidic nitride.

4. The method defined in claim 3, wherein the light-damping film is formed to be thin by a dry etching method using a reactive gas of chlorine family or a wet etching method using a cerium diammonium nitrate solution.

5. The method as defined in claim 1, wherein the light-damping film has a two-layered structure formed of a halftone film in contact with the surface of the transparent substrate and a shading film formed on the halftone film.

6. The method as defined in claim 5, wherein the halftone film has thickness to transmit 5 to 15% of a exposure light.

7. The method as defined in claim 5, wherein the shading film is removed by using a cerium diammonium nitrate solution.

8. The method as defined in claim 5, wherein the halftone film is formed of either of chromium oxide and chromium oxidic nitride.

9. The method as defined in claim 5, wherein the halftone film contains fluorine and the shading film is removing by wet-etching as using the second resist as a mask.

10. The method as defined in claim 5, wherein the shading film is formed of chromium.

11. The method as defined in claim 1, wherein a dented part to be a phase shifter is formed in the transparent substrate as using the first resist as a mask after opening the light-transmitting pattern.

12. The method as defined in claim 1, further comprising a step of forming a phase shifter pattern composed of a transparent film on the halftone film after removing the second resist.

13. The method as defined in claim 12, wherein the transparent film is formed of silicon oxide.

14. A method for forming a halftone pattern of a phase shift mask, comprising the steps of:

forming a halftone film on a transparent substrate;

forming a light-damping film on the halftone film;

applying a first resist on the light-damping film;

patterning the first resist;

forming a light-transmitting pattern on the light-damping film and the halftone film by etching using the first resist pattern as an etching mask;

applying a second resist of a negative type on the light-transmitting pattern such that at least a light-transmitting portion of the light-transmitting pattern is filled up with the second resist;

exposing the second resist to a light through a reverse side of the transparent substrate using the light-damping film as a mask, thereby enabling only the light-exposed portion of the second resist to be non-soluble in a developer;

removing unexposed portions of the second resist by developing thereof; and removing the light-damping film using the remaining second resist as an etching mask, thereby exposing a part of the halftone film.

15. The method as defined in claim 14, wherein the halftone film is formed with thickness to transmit 5 to 15% of an exposure light.

16. The method as defined in claim 14, wherein the halftone film is formed with a sufficient thickness to shift an exposure light by 180 degrees in phase.

17. The method defined in claim 14, wherein the second resist is exposed by using another light.

18. A method for manufacturing a phase shift mask, comprising:

forming one after another a halftone film containing fluorine and a shading film on a transparent substrate;

applying a resist onto the shading film;

forming an opening in a light-transmitting area of the resist by exposing and developing;

opening a light-transmitting pattern in the halftone film and the shading film by etching the halftone film and the shading film as using the resist as a mask; and removing the shading film without a shading area by means of a wet-etching method using the resist as a mask after removing a part of the resist existing outside the shading area.

19. The method for manufacturing a phase shift mask as defined in claim 18, wherein the halftone film is made of either of chromium oxide and chromium oxidic nitride.

20. The method for manufacturing a phase shift mask as defined in claim 18, wherein the halftone film has thickness enough to shift an exposure light by 180 degrees in phase.

21. The method for manufacturing a phase shift mask as defined in claim 18, wherein the halftone film has thickness to transmit 5 to 15% of an exposure light.

22. The method for manufacturing a phase shift mask as defined in claim 18, wherein the shading film is made of chromium.

23. The method for manufacturing a phase shift mask as defined in claim 18, wherein the shading area exists around a device area.

24. The method for manufacturing a phase shift mask as defined in claim 18, wherein the shading film is removed by using a cerium diammonium nitrate solution.

25. A phase shift mask comprising:

a transparent substrate; and a halftone film containing fluorine formed on the transparent substrate.

26. The phase shift mask as defined in claim 25, wherein an opening to be a light-transmitting pattern is formed in the halftone film, and a shading film is formed on the halftone film at a shading area.

* * * * *